(12) United States Patent
Lee (10) Patent No.: US 9,323,231 B2
(45) Date of Patent: Apr. 26, 2016

(54) SEMICONDUCTOR DEVICE BEING CAPABLE OF IMPROVING THE BREAKDOWN CHARACTERISTICS

(71) Applicant: SK hynix Inc., Gyeonggi-do (KR)

(72) Inventor: Yeonghun Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/466,732

(22) Filed: Aug. 22, 2014

(65) Prior Publication Data

US 2015/0277392 A1    Oct. 1, 2015

(30) Foreign Application Priority Data

Apr. 1, 2014 (KR) .................. 10-2014-0038817

(51) Int. Cl.
*G05F 1/00* (2006.01)
*G05B 11/01* (2006.01)
*G11C 16/30* (2006.01)

(52) U.S. Cl.
CPC ............... *G05B 11/01* (2013.01); *G11C 16/30* (2013.01); *Y10T 307/549* (2015.04)

(58) Field of Classification Search
USPC ........................................... 315/291
See application file for complete search history.

(56) References Cited

U.S. PATENT DOCUMENTS

2008/0175077 A1* 7/2008 Lee .............. G11C 11/413
                                                365/189.16
2009/0256493 A1* 10/2009 Tonomura ........... G09G 3/006
                                                315/291

FOREIGN PATENT DOCUMENTS

KR    1020100099960    9/2010
KR    1020120066936    6/2012

* cited by examiner

*Primary Examiner* — Hoai V Ho
(74) *Attorney, Agent, or Firm* — IP & T Group LLP (57) ABSTRACT

A semiconductor device, wherein the semiconductor device includes a high-voltage supply circuit suitable for supplying a high voltage; a discharge circuit suitable for discharging the high voltage; and an auxiliary-voltage supply circuit suitable for supplying a first auxiliary voltage, which varies according to an operation state of the high-voltage supply circuit, to a reference node of the discharge circuit.

7 Claims, 7 Drawing Sheets

SEMICONDUCTOR DEVICE BEING CAPABLE OF IMPROVING THE BREAKDOWN CHARACTERISTICS

CROSS-REFERENCE TO RELATED APPLICATION

The present application claims priority to Korean patent application number 10-2014-0038817, filed on Apr. 1, 2014, the entire disclosure of which is incorporated herein in its entirety by reference.

BACKGROUND

1. Field of Invention

Various exemplary embodiments of the present invention relate to a semiconductor device, and more specifically to a semiconductor device using a high voltage.

2. Description of Related Art

Although the external voltage supplied to semiconductor device is generally low, a high internal voltage is still. To this end, the semiconductor device internally generates and uses a high voltage.

However, there are breakdown characteristics as a result of internal high voltage applications which increase as size of the semiconductor device becomes smaller. Worsening of the breakdown characteristics degrades the overall electrical characteristics of the semiconductor device.

SUMMARY

Various exemplary embodiments of the present invention are directed to a semiconductor device with improved electrical characteristics for high voltage applications.

One embodiment of the present invention provides a semiconductor device including a high-voltage supply circuit suitable for supplying a high voltage; a discharge circuit suitable for discharging the high voltage; and an auxiliary-voltage supply circuit suitable for supplying a first auxiliary voltage, which varies according to operation state of the high-voltage supply circuit, to a reference node of the discharge circuit.

Another embodiment of the present invention provides a semiconductor device including a high-voltage supply circuit suitable for supplying a high voltage; an auxiliary-voltage supply circuit suitable for supplying an auxiliary voltage, which varies according to the operation state of the high-voltage supply circuit; and a transfer circuit suitable for transferring an input voltage in response to the high voltage and the auxiliary voltage.

Still another embodiment of the present invention provides a semiconductor device including a memory block including memory cells, a high-voltage supply circuit suitable for supplying a high voltage, an auxiliary-voltage supply circuit suitable for supplying a first auxiliary voltage, which varies according to the operation state of the high-voltage supply circuit, and a transfer circuit connected between global lines and the local lines of the memory block, and suitable for transferring operation voltages of the global lines to the local lines in response to the high voltage and the first auxiliary voltage.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Throughout the specification, it will be understood that when an element is referred to as being "connected" or "coupled" to another element, it can be directly connected or coupled to the other element or intervening elements may be present. Further, it will be further understood that the terms "comprises," "comprising" "includes," and/or "including," when used herein, specify the presence of stated features, items, steps, operations, elements, and/or components, but do not preclude the presence or addition of one or more other features, items, steps, operations, elements, components, and/or groups thereof.

Figure 1:
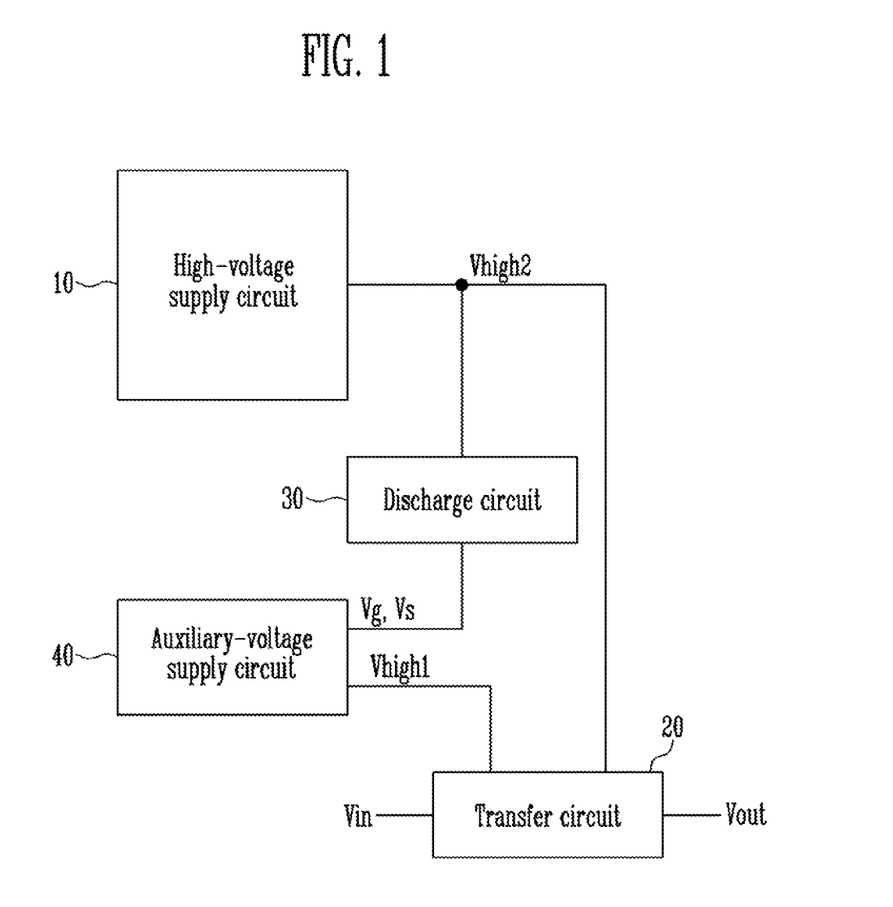
FIG. 1 is a block diagram illustrating a semiconductor device according to an embodiment of the present invention.
Figure 2:
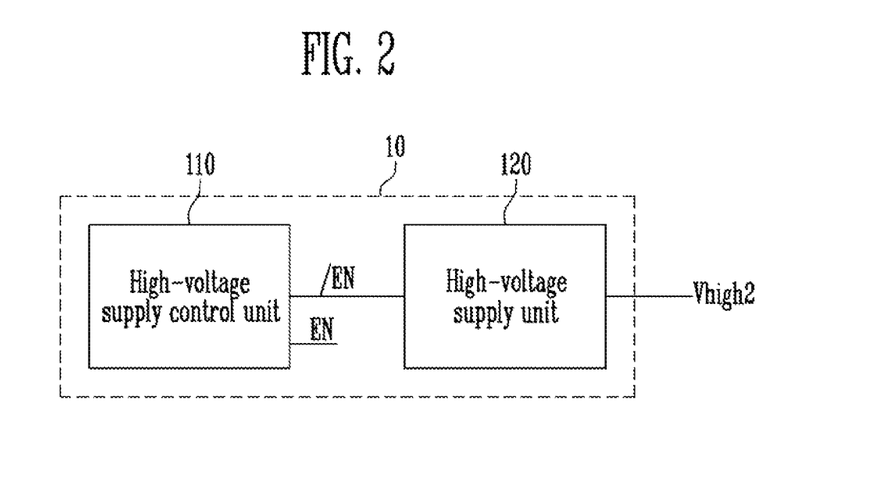
FIG. 2 is a block diagram illustrating a high-voltage supply circuit shown in FIG. 1.
Figure 3:
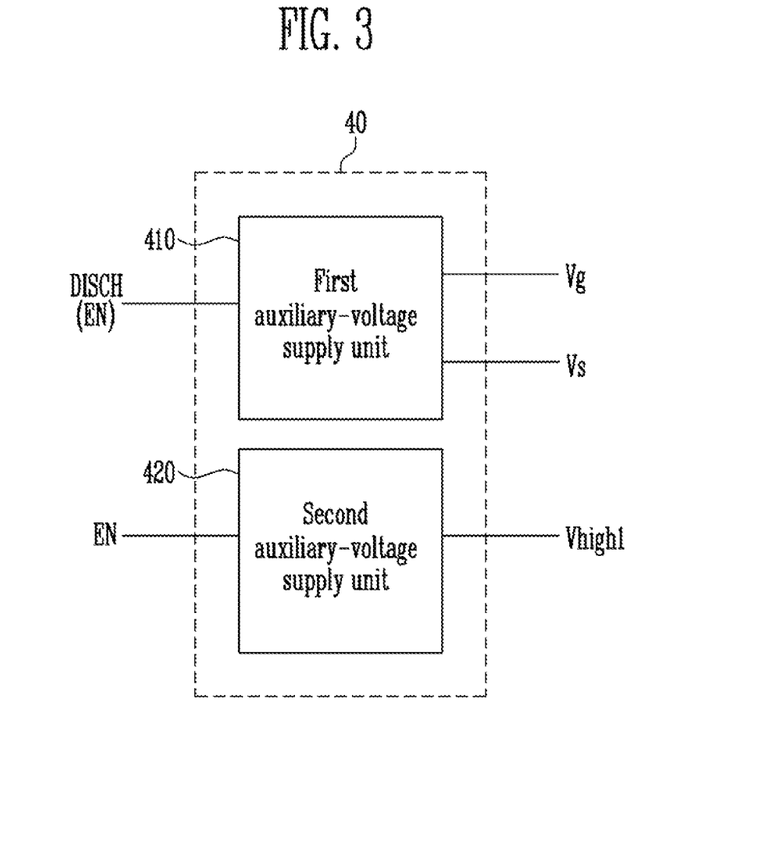
FIG. 3 is a block diagram illustrating an auxiliary-voltage supply circuit shown in FIG. 1.
Figure 4:
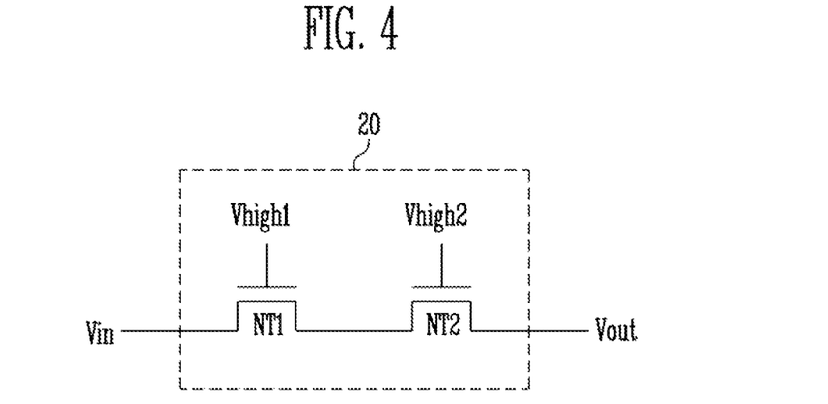
FIG. 4 is a circuit diagram illustrating a transfer circuit shown in FIG. 1.
Figure 5:
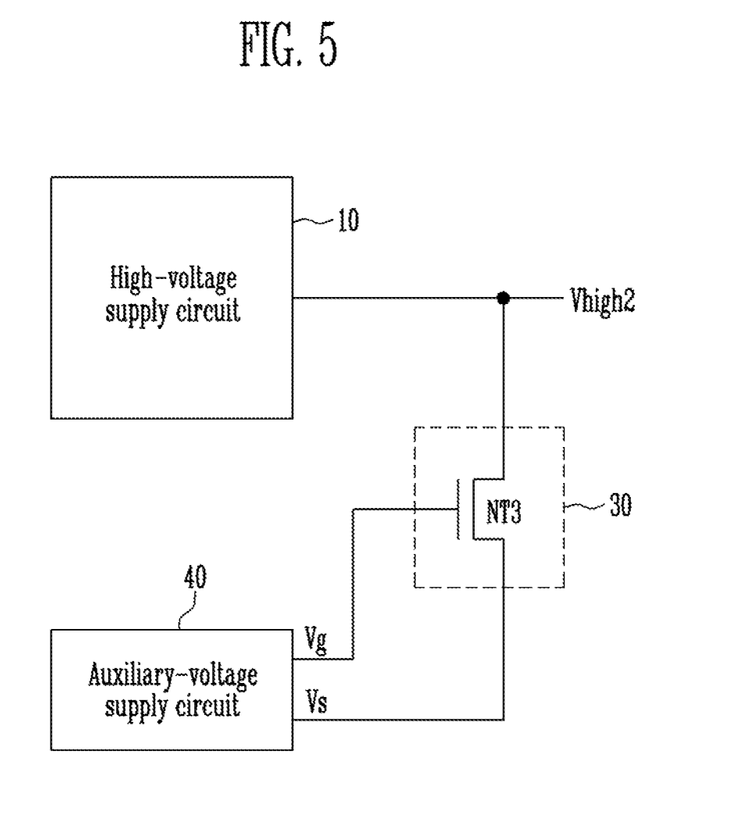
FIG. 5 is a circuit diagram illustrating a discharge circuit shown in FIG. 1.

FIG. 1 is a block diagram illustrating a semiconductor device according to an embodiment. FIG. 2 is a block diagram illustrating a high-voltage supply circuit shown in FIG. 1. FIG. 3 is a block diagram illustrating an auxiliary-voltage supply circuit shown in FIG. 1. FIG. 4 is a circuit diagram illustrating a transfer circuit shown in FIG. 1. FIG. 5 is a circuit diagram illustrating a discharge circuit shown in FIG. 1.

Referring to FIG. 1, the semiconductor device may include a high-voltage supply circuit 10, a transfer circuit 20, a discharge circuit 30, and an auxiliary-voltage supply circuit 40. The semiconductor device may include one or both of the transfer circuit 20 and the discharge circuit 30.

The high-voltage supply circuit 10 may supply a high voltage Vhigh2. The auxiliary-voltage supply circuit 40 may supply auxiliary voltages Vg, Vs, and Vhigh1 to the transfer circuit 20 and the discharge circuit 30. The transfer circuit 20 may transfer an input voltage Vin as an output voltage Vout in response to the high voltage Vhigh2 and the auxiliary voltage Vhigh1. The discharge circuit 30 may discharge an output node of the high-voltage supply circuit 10 in response to the auxiliary voltages Vg and Vs of the auxiliary-voltage supply circuit 40 when the high-voltage supply circuit 10 does not operate. Each configuration will be described in detail below.

Referring to FIG. 2, the high-voltage supply circuit 10 may include a high-voltage supply control unit 110, and a high-voltage supply unit 120. The high-voltage supply control unit 110 may output a control signal for controlling the high-voltage supply unit 120, for example, an inverted enable signal /EN. The high-voltage supply control unit 110 may also output an enable signal EN. The enable signal EN may be outputted to other circuits such as the auxiliary-voltage supply circuit 120. The high-voltage supply unit 120 may supply the high voltage Vhigh2 in response to the control signal EN of the high-voltage supply control unit 110.

Referring to FIG. 3 the auxiliary-voltage supply circuit 40 may supply the auxiliary voltages Vg, Vs, and Vhigh1, each of which may have different levels according to activation of the high-voltage supply circuit 10, the transfer circuit 20, and the discharge circuit 30.

For example, the auxiliary-voltage supply circuit 40 may output an auxiliary voltage Vhigh1 having the same level as the high voltage Vhigh2 when the high-voltage supply circuit 10 operates. In contrast, the auxiliary-voltage supply circuit 40 may output an auxiliary voltage Vhigh1 having a lower level than the input voltage Vin when the high-voltage supply circuit 10 does not operate. Preferably, the auxiliary-voltage supply circuit 40 may output the auxiliary voltage Vhigh1 having a level lower than the input voltage Vin and higher than the high voltage Vhigh2 when the high-voltage supply circuit 10 does not operate.

When the high-voltage supply circuit 10 operates, the auxiliary-voltage supply circuit 40 may apply the auxiliary voltage Vs having a positive polarity with reference to a ground node of the discharge circuit 30. In contrast, when the high-voltage supply circuit 10 does not operate, the auxiliary-voltage supply circuit 40 may apply an auxiliary voltage Vs having a ground level with reference to the ground node of the discharge circuit 30.

Referring to FIG. 5, the discharge circuit 30 may be implemented with a transistor NT3, which may receive a high voltage Vhigh2 from the high-voltage supply circuit 10 at its drain, an auxiliary voltage Vs from the auxiliary-voltage supply circuit 40 at its source, and an auxiliary voltage Vg from the auxiliary-voltage supply circuit 40 at its gate. The source of the transistor NT3 or the discharge circuit 30 for receiving the auxiliary voltage Vs from the auxiliary-voltage supply circuit 40 may be a ground node.

Referring back to FIG. 3, the auxiliary-voltage supply circuit 40 may apply the auxiliary voltage Vg to the gate of a transistor NT3 of the discharge circuit 30. For example, when the high-voltage supply circuit 10 operates, the auxiliary-voltage supply circuit 40 may apply the auxiliary voltage Vg having a ground level to the gate of the transistor NT3 of the discharge circuit 30. Further, when the high-voltage supply circuit 10 does not operate, the auxiliary-voltage supply circuit 40 may apply the auxiliary voltage Vg having a positive polarity to the gate of the transistor NT3 of the discharge circuit 30. Here, the auxiliary-voltage supply circuit 40 may adjust the level of the auxiliary voltage Vg applied to the gate of the transistor NT3 so that the transistor NT3 is turned off when the high-voltage supply circuit 10 operates, and the transistor NT3 is turned on when the high-voltage supply circuit 10 does not operate. Specifically, the auxiliary-voltage supply circuit 40 may apply the auxiliary voltage Vg, the level of which is less than the sum of the auxiliary voltage Vs applied to the ground node of the discharge circuit 30 and a threshold voltage of the transistor NT3, to the gate of the transistor NT3 when the high-voltage supply circuit 10 operates in order to turn off the transistor NT3 or the discharge circuit 30.

The auxiliary-voltage supply circuit 40 may include a first auxiliary-voltage supply unit 410 and a second auxiliary-voltage supply unit 420. The first auxiliary-voltage supply unit 410 may supply the auxiliary voltages Vg and Vs to the discharge circuit 30 in response to a discharge signal DISCH. The second auxiliary-voltage supply unit 420 may supply the auxiliary voltage Vhigh1 to the transfer circuit 20 in response to a control signal such as the enable signal EN.

The discharge signal DISCH input to the first auxiliary-voltage supply unit 410 and the control signal EN input to the second auxiliary-voltage supply unit 420 may be the same signal, and be provided from the high-voltage supply control unit 110 of the high-voltage supply circuit 10. Therefore, the auxiliary voltages Vg, Vs, and Vhigh1 may be outputted together to the transfer circuit 20 and the discharge circuit 30 in response to the control signal EN.

Referring to FIG. 4, the transfer circuit 20 may transfer the input voltage Vin as the output voltage Vout in response to the high voltage Vhigh2 of the high-voltage supply circuit 10, and the auxiliary voltage Vhigh1 of the auxiliary-voltage supply circuit 40.

The transfer circuit 20 may include serially coupled first and second transistors NT1 and NT2. The first transistor NT1 may transfer the input voltage Vin to the second transistor NT2 in response to the auxiliary voltage Vhigh1 from the auxiliary-voltage supply circuit 40. The second transistor NT2 may transfer the output from the first transistor NT1 as the output voltage Vout in response to the high voltage Vhigh2 from the high-voltage supply circuit 10.

It is preferable that the high voltage Vhigh2 and the auxiliary voltage Vhigh1 are at least higher than the input voltage Vin by the threshold voltage of the second transistor NT2 and the first transistor NT1, respectively. That is, the output voltage Vout of the transfer circuit 20 may be maintained at the same level as the input voltage Vin of the transfer circuit 20.

Hereinafter, improvement of breakdown characteristics of the semiconductor device in accordance with an embodiment of the present invention will be described. First, improvement of the breakdown characteristics of the transfer circuit 20 will be described.

Referring to FIGS. 1 and 4, the auxiliary-voltage supply circuit 40 may output an auxiliary voltage Vhigh1 having the same level as the high voltage Vhigh2 when the high-voltage supply circuit 10 operates or when the high voltage Vhigh2 is output. As a result, the transfer circuit 20 may transfer the input voltage Vin as the output voltage Vout in response to the high voltage Vhigh2 and the auxiliary voltage Vhigh1. Because the high voltage Vhigh2 and the auxiliary voltage Vhigh1 may be higher than the input voltage Vin by the threshold voltages of the second and first transistors NT2 or NT1, respectively, the transfer circuit 20 may transfer the input voltage Vin as the output voltage Vout without a voltage drop, and the output voltage Vout may be maintained at the same level as the input voltage Vin.

Assume that the transfer circuit 20 as a comparison example includes the second transistor NT2 only. When the high-voltage supply circuit 10 does not operate or when the high voltage Vhigh2 is not output, or is maintained at a low level, the high-voltage supply circuit 10 applies the voltage Vhigh2 at a low level to the gate of the second transistor NT2 of the transfer circuit 20 while the input voltage Vin having a high level is input to the drain of the second transistor NT2. The high voltage difference between the voltages applied to the gate and drain of the second transistor NT2 causes a breakdown of the second transistor NT2.

In accordance with the embodiment of the present invention as shown in FIG. 4, when the high-voltage supply circuit 10 does not operate, the auxiliary-voltage supply circuit 40 may apply the auxiliary voltage Vhigh1, which is lower than the input voltage Vin and higher than the output voltage Vhigh2 of the high-voltage supply circuit 10, to the gate of the first transistor NT1, and the breakdown characteristics of the second transistor NT2 may be improved. This will be described in detail below.

When the auxiliary-voltage supply circuit 40 applies an auxiliary voltage Vhigh1 lower than the input voltage Vin to the gate of the first transistor NT1, the first transistor NT1 may transfer a voltage lower than the auxiliary voltage Vhigh1 by the threshold voltage thereof. That is, the input voltage Vin may be applied to the first transistor NT1 while a low voltage, which is the auxiliary voltage Vhigh1 minus the threshold voltage Vth of the transistor NT1, i.e., Vhigh1−Vth, may be transferred to the second transistor NT2. Since the voltage Vhigh1−Vth lowered by the first transistor NT1 is applied to the second transistor NT2, the breakdown characteristics of the second transistor NT2 may be improved by reducing the input voltage to the second transistor NT2. Thus, the breakdown characteristics of the transistor circuit 20 and the semiconductor device may be improved by the first transistor NT1 and the auxiliary voltage Vhigh1.

Improvement of breakdown characteristics of the discharge circuit 30 will now be described.

Referring to FIG. 5, when the high-voltage supply circuit 10 does not operate or when the high voltage Vhigh2 is not outputted, or is maintained at a low level, the auxiliary-voltage supply circuit 40 may apply an auxiliary voltage Vs having the ground level to the ground node of the discharge circuit 30. More specifically, the auxiliary-voltage supply circuit 40 may apply an auxiliary voltage Vg having a positive polarity to the gate of the transistor NT3 of the discharge circuit 30, and the auxiliary voltage Vs having the ground level to the ground node of the transistor NT3. The transistor NT3 is turned on by the auxiliary voltages Vg and Vs, and the high-voltage supply circuit 10 is normally discharged.

When the high-voltage supply circuit 10 operates or when the high voltage Vhigh2 is outputted, the operation of the discharge circuit 30 is stopped. That is, the transistor NT3 of the discharge circuit 30 should be turned off. Assume for a comparison example that the ground voltage is applied to the source and gate of the transistor NT3 in order to turn off the transistor NT3. In such a case, the high voltage difference between the drain of the transistor NT3, to which the high voltage Vhigh2 is applied, and the gate of the transistor NT3 is formed, and a breakdown of the transistor NT3 may occur due to the high voltage difference.

In order to prevent the breakdown of the transistor NT3 in accordance with an embodiment of the present invention, the auxiliary-voltage supply circuit 40 may supply auxiliary voltages Vg and Vs having a positive polarity to the discharge circuit 30. For example, the auxiliary-voltage supply circuit 40 may apply an auxiliary voltage Vs having a positive polarity to the ground node of the discharge circuit 30. More specifically, the auxiliary-voltage supply circuit 40 may apply the auxiliary voltage Vs having a positive polarity to the source of the transistor NT3 corresponding to the ground node. Further, the auxiliary-voltage supply circuit 40 may also apply the auxiliary voltage Vg of the positive polarity to the gate of the transistor NT3. In this case, it is preferable that the auxiliary-voltage supply circuit 40 apply the auxiliary voltage Vg, which is lower than the sum of the auxillary voltage Vs applied to the ground node, and a threshold voltage of the transistor NT3, to the gate of the transistor NT3 in order for the transistor NT3 to remain turned-off.

As the auxiliary-voltage supply circuit 40 applies the auxiliary voltages Vg and Vs to the discharge circuit 30 with the above conditions, the transistor NT3 may remain turned-off while the voltage difference between the gate of the transistor NT3 and the drain, to which the high voltage Vhigh2 is applied, may be reduced. As a result, the breakdown characteristics of the second transistor NT3 included in the discharge circuit 30 may be improved with the application of the auxiliary voltages Vg and Vs.

Figure 6:
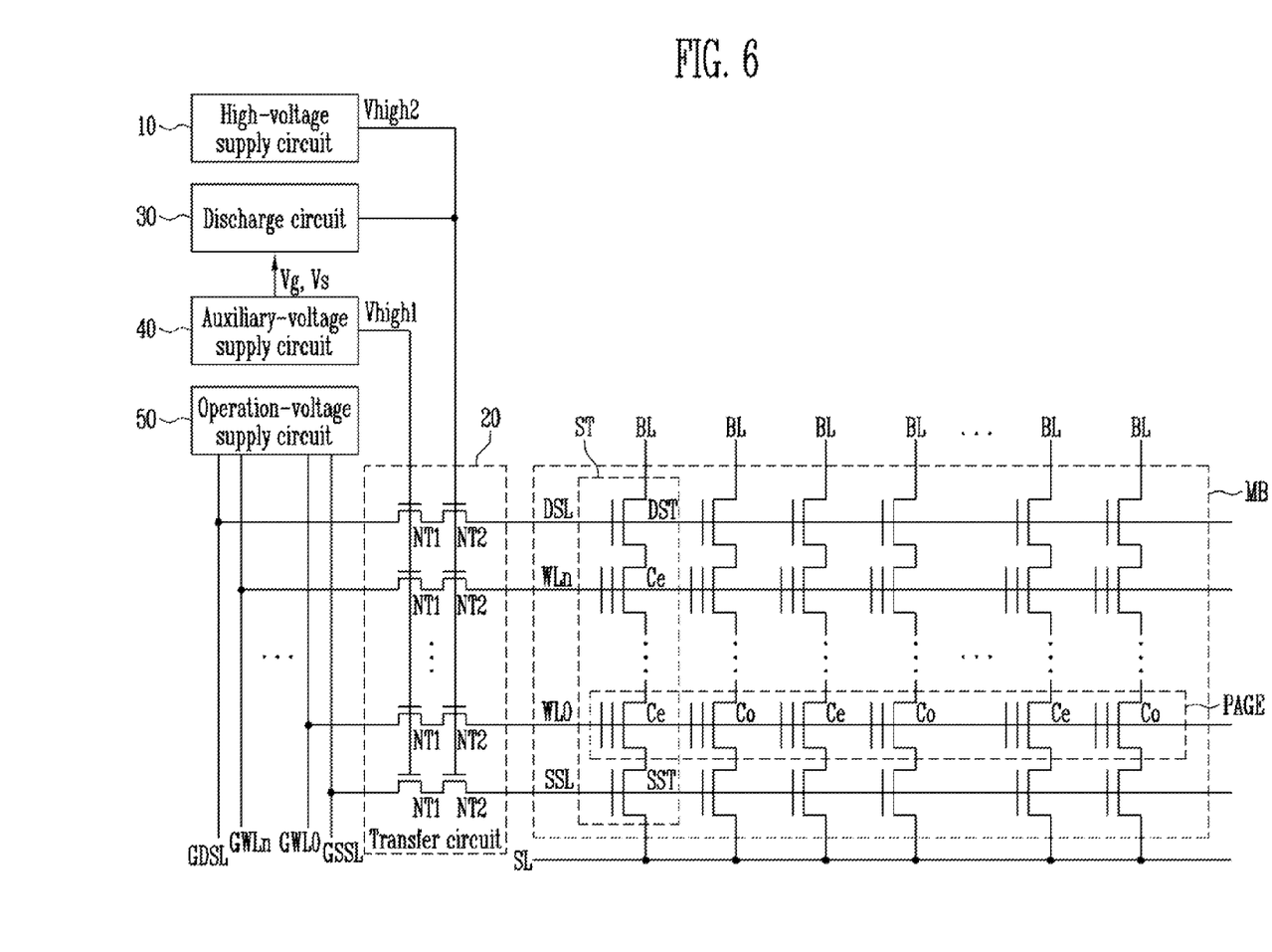
FIG. 6 is a block diagram illustrating a semiconductor device according to an embodiment of the present invention.

Hereinafter, a flash memory device as an example of the semiconductor device in accordance with an embodiment of the present invention described above will be demonstrated. FIG. 6 is a block diagram illustrating a semiconductor device according to an embodiment of the present invention.

Referring to FIG. 6, the semiconductor device may include a memory block MB and operation circuits 10 to 50. The operation circuits may include a high-voltage supply circuit 10, a transfer circuit 20, a discharge circuit 30, an auxiliary-voltage supply circuit 40, and an operation-voltage supply circuit 50. The high-voltage supply circuit 10, the transfer circuit 20 the discharge circuit 30, and the auxiliary-voltage supply circuit 40 shown in FIG. 6 may correspond to the high-voltage supply circuit 10, the transfer circuit 20, the discharge circuit 30 and the auxiliary-voltage supply circuit 40 described above with reference to FIGS. 1 to 5. The operation-voltage supply circuit 50 may output a signal corresponding to the input voltage Vin described above with reference to FIGS. 1 to 5.

The memory block MB may include a plurality of memory strings ST connected between bit lines BL and a common source line SL. Memory cells Ce and Co may be connected to each word line WL0 to WLn. The memory strings ST may be connected to the bit lines BL, respectively, and connected in common to the common source line SL. Each memory string ST may include a source select transistor SST, having a source connected to the common source line SL, a cell string, having a plurality of memory cells Ce connected in series, and a drain select transistor DST, having a drain connected to the bit line BL. The memory cells Ce included in the cell string are connected in series between the select transistors SST and DST.

A gate of the source select transistor SST may be connected to a source select line SSL, gates of the memory cells Ce and Co may be connected to the word lines WL0 to WLn, and a gate of the drain select transistor DST may be connected to a drain select line DSL. The drain select transistor DST may control the connection or disconnection of the cell string Ce with the bit line, and the source select transistor may SST control the connection or disconnection of the cell string Ce with the common source line SL.

In a NAND flash memory device, memory cells and flag cells included in a memory cell block may be classified in units of physical pages or logical pages. For example, memory cells Ce and Co connected to one word line (e.g., WL0) form one physical page. Even-numbered memory cells Ce connected to one word line (e.g., WL0) may configure one even physical page, and odd-numbered memory cells Co may configure one odd physical page. The page (or, an even page and an odd page) may be the basic unit of a program operation or a read operation.

The high-voltage supply circuit 10 may output a high voltage Vhigh2 to the transfer circuit 20. Specifically, in the flash memory device, each memory block MB may have the high-voltage supply circuit 10, the discharge circuit 30, and the auxiliary-voltage supply circuit 40, and the high-voltage supply circuit 10 may output the high voltage Vhigh2 in response to a coded address signal. This will be described in detail below.

Figure 7:
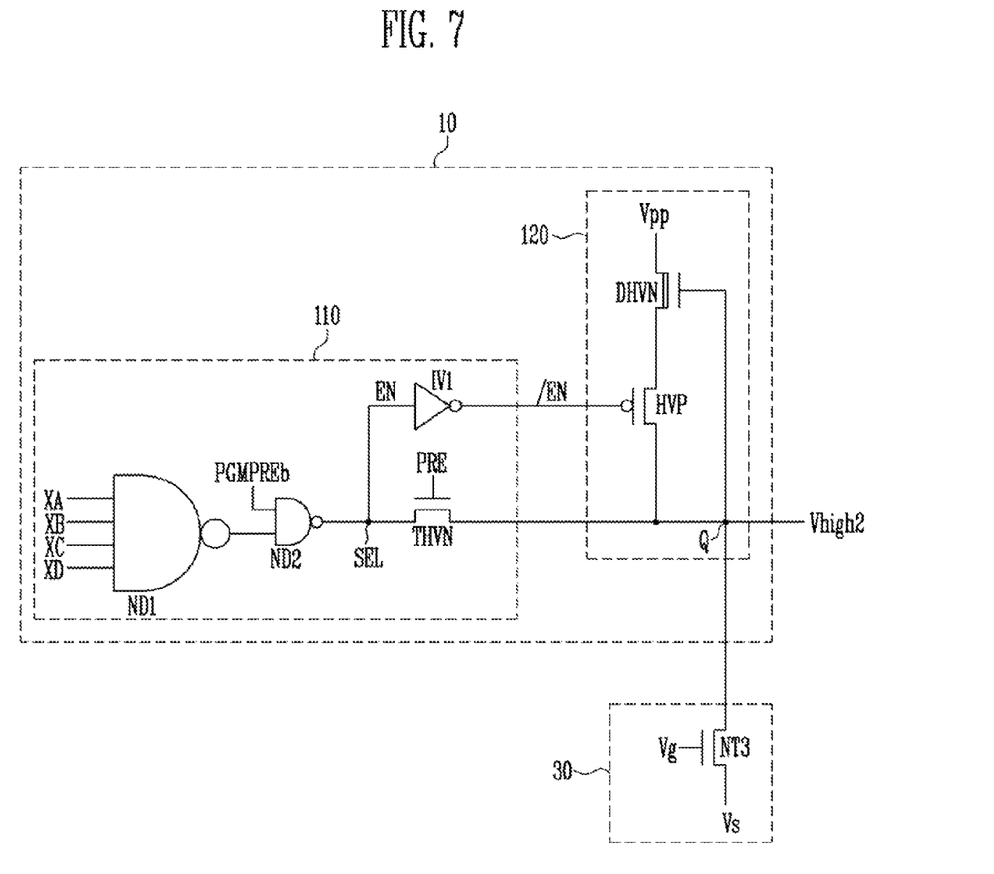
FIG. 7 is a circuit diagram illustrating a high-voltage supply circuit and a discharge circuit shown in FIG. 6.

FIG. 7 is a circuit diagram illustrating the high-voltage supply circuit 10 and the discharge circuit 30 shown in FIG. 6.

Referring to FIG. 7, the high-voltage supply circuit 10 may include a high-voltage supply control unit 110 and a high-voltage supply unit 120. The high-voltage supply control unit 110 may include logic gates ND1 and ND2, an inverter IV1, and a transistor THVN. Each of the logic gates ND1 and ND2 may include a NAND gate.

The first logic gate ND1 may perform a logic NAND operation in response to a plurality of decoded address signals XA, XB, XC, and XD. The second logic gate ND2 may output a control signal or an enable signal EN to a node SEL in response to an output signal of the first logic gate ND1 and a program precharge signal PGMPREb. The control signal EN may be applied to the auxiliary-voltage supply circuit 40. The inverter IV1 may output an inverted control signal or an inverted enable signal /EN by inverting the voltage of the node SEL.

The transistor THVN transfers the voltage of the node SEL to an output node Q in response to a precharge signal PRE. The output node Q is precharged by a voltage transferred through the transistor THVN.

The high-voltage supply unit 120 may include a depletion transistor DHVN and a high voltage P-channel Mosfet (PMOS) transistor HVP. The depletion transistor DHVN and the high voltage PMOS transistor HVP may be connected in series between a pumping voltage Vpp and the output node Q. A drain of the depletion transistor DHVN may be connected to the pumping voltage Vpp, and a gate of the depletion transistor DHVN may be connected to the output node Q. The high voltage PMOS transistor HVP may be connected between the depletion transistor DHVN and the output node Q, and may operate in response to the inverted enable signal /EN.

When the high voltage PMOS transistor HVP is turned on in response to the inverted enable signal /EN, and the output node Q is precharged by the voltage transferred through the depletion transistor THVN, the pumping voltage Vpp may be transferred to the output node Q, and the voltage Vhigh2 of the output node Q may be increased to a high level. For example, the voltage Vhigh2 of the output node Q may be increased by the electrical potential of the enable signal EN, and the depletion transistor DHVN may transfer the pumping voltage Vpp to the high voltage PMOS transistor HVP in response to the voltage Vhigh2 of the output node Q. The depletion transistor DHVN having a negative threshold voltage may pass a certain amount of current even when the voltage Vhigh2 of the output node Q applied to the gate is 0 V. The high voltage PMOS transistor HVP may be turned on in response to the inverted enable signal /EN, and transfer the pumping voltage Vpp to the output node Q. As a result, the voltage Vhigh2 of the output node Q may be further increased. Because of this, the amount of current flowing through the depletion transistor DHVN may be further increased, and the voltage Vhigh2 of the output node Q may be increased to the level of the pumping voltage Vpp.

As described above, in the flash memory device in accordance with an embodiment of the present invention, the high-voltage supply circuit 10 may output the high voltage Vhigh2 in response to the plurality of decoded address signals XA, XB, XC, and XD. That is, the high-voltage supply circuit 10 may output the high voltage Vhigh2 only when the corresponding memory block is selected according to the plurality of decoded address signals XA, XB, XC, and XD.

Referring again to FIG. 6, the transfer circuit 20 may be connected between global lines GSSL, GWL0 to GWLn, and GDSL, and local lines SSL, WL0 to WLn, and DSL of the memory block MB, and may operate in response to the high voltage Vhigh2 of the high-voltage supply circuit 10 and the auxiliary voltage Vhigh1 of the auxiliary-voltage supply circuit 40. That is, the transfer circuit 20 may perform an operation for connecting the global lines GSSL, GWL0 to GWLn, and GDSL to the local lines SSL, WL0 to WLn, and DSL of the selected memory block MB in response to the high voltage Vhigh2 and the auxiliary voltage Vhigh1. That is, operation voltages (e.g., a program voltage, an erase voltage, a read voltage, a pass voltage, a verify voltage, etc.), which are output from the operation-voltage supply circuit 50 to the global lines GSSL, GWL0 to GWLn, and GDSL may be transferred to the local lines SSL, WL0 to WLn, and DSL of the selected memory block MB.

The transfer circuit 20 may include transistors NT1 and NT2 connected in series between each of the global lines GSSL, GWL0 to GWLn, and GDSL, and each of the local lines SSL, WL0 to WLn, and DSL. The transistor NT1 may operate in response to the auxiliary voltage Vhigh1, and the transistor NT2 may operate in response to the high voltage Vhigh2.

The discharge circuit 30 may be connected to the output node Q of the high-voltage supply circuit 10 and may perform an operation for discharging the output node Q when the high-voltage supply circuit 10 does not operate.

The auxiliary-voltage supply circuit 40 may output the auxiliary voltage Vhigh1 to the transfer circuit 20, and the auxiliary voltages Vs and Vg to the discharge circuit 30. Specifically, the auxiliary-voltage supply circuit 40 may output the auxiliary voltage Vhigh1 to the transfer circuit 20 in response to the control signal EN generated according to the coded address signals received from the high-voltage supply circuit 10. That is, only when the corresponding memory block MB is selected according to the plurality of decoded address signals XA, XB, XC, and XD, may the auxiliary-voltage supply circuit 40 output the auxiliary voltage Vhigh1 in response to the control signal EN.

Thus, since the high voltage Vhigh2 and the auxiliary voltage Vhigh1 are output only when the corresponding memory block MB is selected according to the plurality of decoded address signals XA, XB, XC, and XD, may the high voltage Vhigh2 and the auxiliary voltage Vhigh1 correspond to a block select signal indicating that the memory block is selected.

The operation-voltage supply circuit 50 may output the operation voltages required for a program operation, a read operation, and an erase operation of the memory cells to the global lines GSSL, GWL0 to GWLn, and GDSL.

The transfer circuit 20 may transfer the operation voltages of the global lines GSSL, GWL0 to GWLn, and GDSL to the local lines SSL, WL0 to WLn, and DSL of the selected memory block MB from a plurality of memory blocks (not illustrated) in response to the high voltage Vhigh2 of the high-voltage supply circuit 10 and the auxiliary voltage Vhigh1 of the auxiliary-voltage supply circuit 40.

While the high-voltage supply circuit 10 supplies the high voltage Vhigh2 to the transfer circuit 20, the auxiliary-voltage supply circuit 40 may output the auxiliary voltages Vs and Vg to the discharge circuit 30 for improving the breakdown characteristics of the discharge circuit 30. Further, the auxiliary-voltage supply circuit 40 may output the auxiliary voltage Vhigh1 to the transfer circuit 20 for improving the breakdown characteristics of the transfer circuit 20.

Through the above configuration and operations, overall breakdown characteristics of a flash memory device may be improved, and thus the flash memory device may stably operate.

Figure 8:
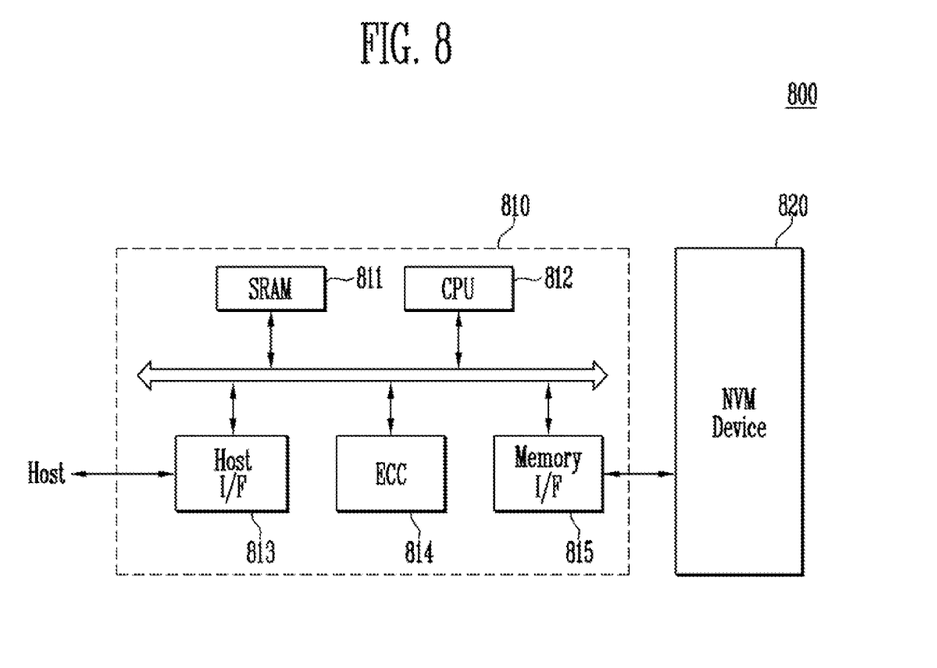
FIG. 8 is a block diagram illustrating a memory system according to an embodiment of the present invention.

FIG. 8 is a block diagram illustrating a memory system according to an embodiment of the present invention.

Referring to FIG. 8, a memory system 800 according to the embodiment of the present invention may include a non-volatile memory device (NVM) 820 and a memory controller 810.

The NVM device 820 may include the semiconductor device illustrated in FIG. 1 or 6. The memory controller 810 may control the NVM device 820. As the NVM device 820 of the memory system 800 may include the semiconductor device described above, operational characteristics of the memory system 800 may be improved.

A memory card or a semiconductor disk device (a solid state disk (SSD)) comprised of a combination of the NVM device 820 and the memory controller 810 may be provided. Static random access memory (SRAM) 811 may be used as an operational memory of a central processing unit (CPU) 812. A host interface (I/F) 813 may provide a data exchange protocol for a host Host connected to the memory system 800. An error correction block (ECC) 814 detects and corrects errors included in data read from the non-volatile memory device 820. A memory I/F 815 may interface with the NVM device 820 of the present invention. The CPU 812 may perform various control operations for data exchange of the memory controller 810.

Although not shown in the drawings, it is apparent to those skilled in the art that the memory system 800 of the present invention may further have a read only memory (ROM) (not shown) and the like configured to store code data for interfacing with the host Host. The NVM device 820 may be implemented as a multi-chip package constituted of a plurality of flash memory chips. The memory system 800 of the present invention may be embodied as a storage medium having a low probability of error occurrence and high reliability. Particularly, in the memory system such as a semiconductor disk device (that is an SSD) in which recent research is being actively conducted, the flash memory device having an embodiment of the present invention may be included. In this case, the memory controller 810 may communicate with the outside (e.g., a host Host) through one of various interface protocols such as a Universal Serial Bus (USB) protocol, a multimedia card (MMC) protocol, a peripheral component interconnect express (PCI-E) protocol, a serial advanced technology attachment (SATA) protocol, a parallel-ATA (PATA) protocol, an enhanced small disk interface (ESDI) protocol, an integrated drive electronics (IDE) protocol, and so on.

Figure 9:
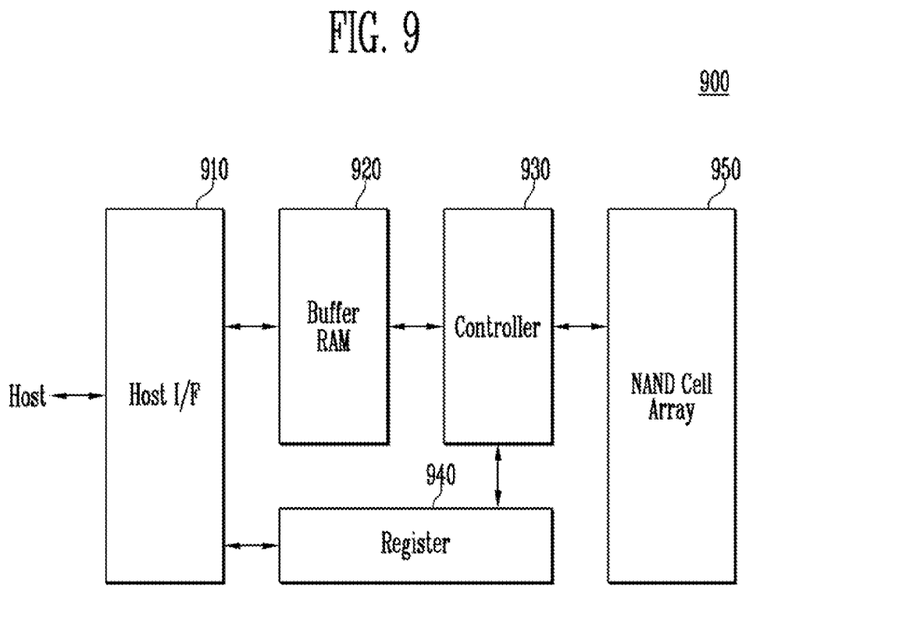
FIG. 9 is a block diagram illustrating a fusion memory system according to an embodiment of the present invention.

FIG. 9 is a block diagram illustrating a fusion memory system according to an embodiment of the present invention. For example, technical characteristics of the semiconductor device described above may be applied to a OneNAND flash memory device 900 as a fusion memory device.

The OneNAND flash memory device 900 may include a host I/F 910 configured to exchange information with a device using different protocols, a buffer RAM 920 configured to have an embedded code for driving the memory device or temporarily storing data, a controller 930 configured to control a read operation, a program operation, and all states in response to a control signal and a command received from the outside, a register 940 configured to store data such as a command, an address, configuration data, which defines the system operational environment inside the memory device, and so on, and a NAND flash cell array 950 having an operational circuit including an NVM cell and a read/write circuit.

Figure 10:
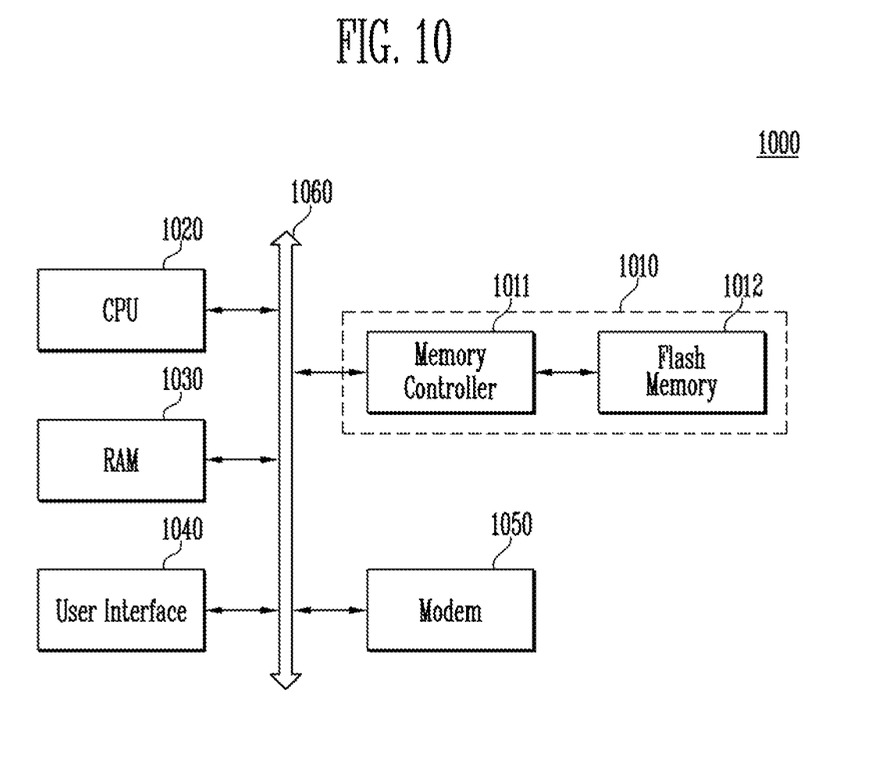
FIG. 10 is a block diagram illustrating a computing system according to an embodiment of the present invention.

FIG. 10 is a block diagram illustrating a computing system according to an embodiment of the present invention.

A computing system 1000 of the present invention may include a CPU 1020 (i.e., microprocessor), a RAM 1030, a user interface 1040, a modem 1050 such as a baseband chipset, and a memory system 1010, which are all electrically connected to a system bus 1060. When the computing system 1000 of the present invention is a mobile device, a battery (not shown) may be further provided to supply an operational voltage to the computing system 1000. Although not shown in the drawings, it is apparent to those skilled in the art that an application chipset, a camera image processor (CIS), a mobile DRAM, and so on may be further provided in the computing system 1000 of the present invention. The memory system 1010, for example, may have an SSD using the above-described semiconductor device in order to store data. Alternatively, the memory system 1010 may be provided as a fusion flash memory (e.g., an OneNAND flash memory).

The embodiments of the present invention can improve the electrical characteristics in high voltage applications.

In the drawings and specification, exemplary embodiments of the invention have been disclosed. Although specific terms are employed, they to be understood in a generic and descriptive sense only and not for purpose of limiting the scope of the current invention. As for the scope of the invention, it is to be set forth by the following claims. Therefore, it will be understood by those of ordinary skill in the art that various changes in form and detail may be made without departing from the spirit and scope of the present invention as defined by the following claims.

What is claimed is:

1. A semiconductor device, comprising:
a high-voltage supply circuit suitable for supplying a high voltage to an output terminal;
a discharge circuit connected between the output terminal and a ground node; and
an auxiliary-voltage supply circuit suitable for supplying a first auxiliary voltage, which varies according to an operation state of the high-voltage supply circuit to the ground node.

2. The semiconductor device of claim 1,
wherein the auxiliary-voltage supply circuit supplies the first auxiliary voltage having a positive polarity to the ground node when the high-voltage supply circuit operates, and
wherein the auxiliary-voltage supply circuit supplies the first auxiliary voltage having a ground level to the ground node when the high-voltage supply circuit does not operate.

3. The semiconductor device of claim 2,
wherein the discharge circuit includes a transistor connected to the ground node, and
wherein, when the high-voltage supply circuit operates, the auxiliary-voltage supply circuit supplies a second auxiliary voltage having a positive polarity to a gate of the transistor.

4. The semiconductor device of claim 1, wherein the discharge circuit includes a transistor connected between the output terminal and the ground node.

5. The semiconductor device of claim 4,
wherein the auxiliary-voltage supply circuit supplies the first auxiliary voltage having a positive polarity to the ground node, and a second auxiliary voltage having a positive polarity to a gate of the transistor when the high-voltage supply circuit operates, and
wherein the auxiliary-voltage supply circuit supplies the first auxiliary voltage having a ground level to the ground node, and the second auxiliary voltage having a positive polarity to the gate of the transistor when the high-voltage supply circuit does not operate.

6. The semiconductor device of claim 5, wherein the first auxiliary voltage having a positive polarity is lower than a sum of the second auxiliary voltage having a positive polarity and a threshold voltage of the transistor, to the gate.

7. The semiconductor device of claim 1,
wherein the high-voltage supply circuit includes:
a high-voltage supply control unit suitable for generating a control signal; and
a high-voltage supply unit suitable for outputting the high voltage in response to the control signal, and
wherein the auxiliary-voltage supply circuit operates in response to the control signal.

\* \* \* \* \*